(12) United States Patent
Landsman

(10) Patent No.: US 8,303,419 B2
(45) Date of Patent: Nov. 6, 2012

(54) GAMING APPARATUS WITH COOLING OF CERTAIN COMPONENTS

(75) Inventor: Andrew Landsman, Chicago, IL (US)

(73) Assignee: WMS Gaming Inc., Waukegan, IL (US)

( * ) Notice: Subject to any disclaimer, the term of this patent is extended or adjusted under 35 U.S.C. 154(b) by 314 days.

(21) Appl. No.: 12/514,158

(22) PCT Filed: Nov. 8, 2007

(86) PCT No.: PCT/US2007/023578
§ 371 (c)(1),
(2), (4) Date: Dec. 29, 2009

(87) PCT Pub. No.: WO2008/060444
PCT Pub. Date: May 22, 2008

(65) Prior Publication Data
US 2010/0160018 A1   Jun. 24, 2010

Related U.S. Application Data

(60) Provisional application No. 60/865,055, filed on Nov. 9, 2006.

(51) Int. Cl.
*A63F 13/08* (2006.01)
(52) U.S. Cl. ............................................. 463/46; 463/47
(58) Field of Classification Search .................. 463/46, 463/47, 16, 20; 62/3.1, 3.2, 3.6, 3.7
See application file for complete search history.

(56) References Cited

U.S. PATENT DOCUMENTS

| | | | |
|---|---|---|---|
| 4,283,709 A | 8/1981 | Lucero | |
| 5,072,597 A | 12/1991 | Bromley et al. | |
| 5,417,433 A | 5/1995 | Phillips | |
| 5,422,832 A | 6/1995 | Moyal | |
| 5,764,506 A | 6/1998 | Eynaud | |
| 5,870,267 A | 2/1999 | Kitano | |
| 6,343,988 B1 * | 2/2002 | Walker et al. | 463/21 |
| 6,439,992 B1 | 8/2002 | Demeter | |
| 6,491,298 B1 | 12/2002 | Criss-Puszkiewicz et al. | |
| 6,667,891 B2 * | 12/2003 | Coglitore et al. | 361/796 |
| 2003/0236594 A1 | 12/2003 | Frankel et al. | |
| 2010/0099487 A1 | 4/2010 | Canterbury et al. | |

FOREIGN PATENT DOCUMENTS

| | | |
|---|---|---|
| WO | WO 01/69694 A1 * | 9/2001 |
| WO | WO-0169694 A1 | 9/2001 |
| WO | WO-2007106479 A2 | 9/2007 |
| WO | WO-2007106479 A3 | 9/2007 |
| WO | WO-2008057400 A2 | 5/2008 |

(Continued)

OTHER PUBLICATIONS

"International Application No. PCT/US2007/006296, Search Report mailed Jul. 24, 2008", 4 pgs.

(Continued)

*Primary Examiner* — David L Lewis
*Assistant Examiner* — Matthew D. Hoel
(74) *Attorney, Agent, or Firm* — Schwegman Lundberg & Woessner, P.A.

(57) ABSTRACT

A system includes a gaming machine, one or more heat generating components within the gaming machine, and a thermoelectric cooler apparatus located within the gaming machine to draw heat from the one or more heat generating components.

14 Claims, 5 Drawing Sheets

FOREIGN PATENT DOCUMENTS

WO    WO-2008057400 A3    5/2008

OTHER PUBLICATIONS

"International Application No. PCT/US2007/006296, Written Opinion mailed Jul. 24, 2008", 5 pgs.

"International Application Serial No. PCT/US2007/023578, International Written Opinion mailed on May 15, 2008", 7 pgs.

"International Application Serial No. PCT/US2007/023578, International Search Report mailed on May 15, 2008", 4 pgs.

"International Application Serial No. PCT/US2007/23106 Search Report mailed May 23, 2008", 4 pgs.

"International Application Serial No. PCT/US2007/23106 Written Opinion mailed May 23, 2008", 7 pgs.

"U.S. Appl. No. 12/445,523, Examiner Interview Summary mailed Mar. 6, 2012", 3 pgs.

"U.S. Appl. No. 12/445,523, Final Office Action mailed Mar. 13, 2012", 11 pgs.

"U.S. Appl. No. 12/445,523, Pre-Interview First Office Action Received mailed Jan. 30 2012", 2 pgs.

"U.S. Appl. No. 12/445,523, Response Filed Feb. 29, 2012 to First Action Interview Office Action mailed Jan. 30, 2012", 7 pgs.

\* cited by examiner

GAMING APPARATUS WITH COOLING OF CERTAIN COMPONENTS

RELATED APPLICATION

This patent application is a U.S. National Stage Filing under 35 U.S.C. 371 from International Patent Application Ser. No. PCT/US2007/023578, filed Nov. 8, 2007, and published on May 22, 2008, as WO 2008/060444 A2 and republished as WO 2008/060444 A3, which claims the priority benefit of U.S. Provisional Patent Application Ser. No. 60/865,055 filed Nov. 9, 2006 and entitled "GAMING APPARATUS WITH COOLING OF CERTAIN COMPONENTS", the contents of which are incorporated herein by reference in their entirety.

LIMITED COPYRIGHT WAIVER

A portion of the disclosure of this patent document contains material which is subject to copyright protection. The copyright owner has no objection to the facsimile reproduction by anyone of the patent disclosure, as it appears in the Patent and Trademark Office patent files or records, but otherwise reserves all copyright rights whatsoever. Copyright 2006, 2007, WMS Gaming, Inc.

FIELD

Embodiments of the inventive subject matter relate generally to wagering game systems, and more particularly, to wagering game systems including cooling of certain components.

BACKGROUND

Computerized wagering games have largely replaced traditional mechanical wagering game machines such as slot machines, and are rapidly being adopted to implement computerized versions of games that are traditionally played live such as poker and blackjack. These computerized games provide many benefits to the game owner and to the gambler, including greater reliability than can be achieved with a mechanical game or human dealer, more variety, sound, and animation in presentation of a game, and a lower overall cost of production and management.

The elements of computerized wagering game systems are in many ways the same as the elements in the mechanical and table game counterparts in that they must be fair, they must provide sufficient feedback to the game player to make the game fun to play, and they must meet a variety of gaming regulations to ensure that both the machine owner and gamer are honest and fairly treated in implementing the game. Further, they must provide a gaming experience that is at least as attractive as the older mechanical gaming machine experience to the gamer, to ensure success in a competitive gaming market.

Computerized wagering games do not rely on the dealer or other game players to facilitate game play and to provide an entertaining game playing environment, but rely upon the presentation of the game and environment generated by the wagering game machine itself. Incorporation of audio and video features into wagering games to present the wagering game, to provide help, and to enhance the environment presented are therefore important elements in the attractiveness and commercial success of a computerized wagering game system. Music and environmental effects are also played through speakers in some wagering game systems to enhance or complement a theme of the wagering game. These sounds typically accompany video presentation of the wagering game on a screen, which itself often includes animation, video, and three-dimensional graphics as part of presentation of the wagering game.

All of these wagering game functions are typically managed by a processor executing wagering game code, which places a significant demand on the processor and related components. Modern processors can dissipate large amounts of power, and can quickly be destroyed if the generated heat is not controlled. Other components such as hard drives can also generate heat. There is a need to provide sufficient cooling so as to ensure proper operation of a computerized wagering game machine.

BRIEF DESCRIPTION OF THE FIGURES

Embodiments of the invention are illustrated by way of example and not limitation in the Figures of the accompanying drawings in which.

DESCRIPTION OF THE EMBODIMENTS

In the following detailed description of example embodiments of the invention, reference is made to specific example embodiments of the invention by way of drawings and illustrations. These examples are described in sufficient detail to enable those skilled in the art to practice the invention, and serve to illustrate how the invention may be applied to various purposes or embodiments. Other embodiments of the invention exist and are within the scope of the invention, and logical, mechanical, electrical, and other changes may be made without departing from the subject or scope of the present invention. Features or limitations of various embodiments of the invention described herein, however essential to the example embodiments in which they are incorporated, do not limit other embodiments of the invention or the invention as a whole, and any reference to the invention, its elements, operation, and application do not limit the invention as a whole but serve only to define these example embodiments. The following detailed description does not, therefore, limit the scope of the invention, which is defined only by the appended claims.

Example Operating Environment

Figure 1:
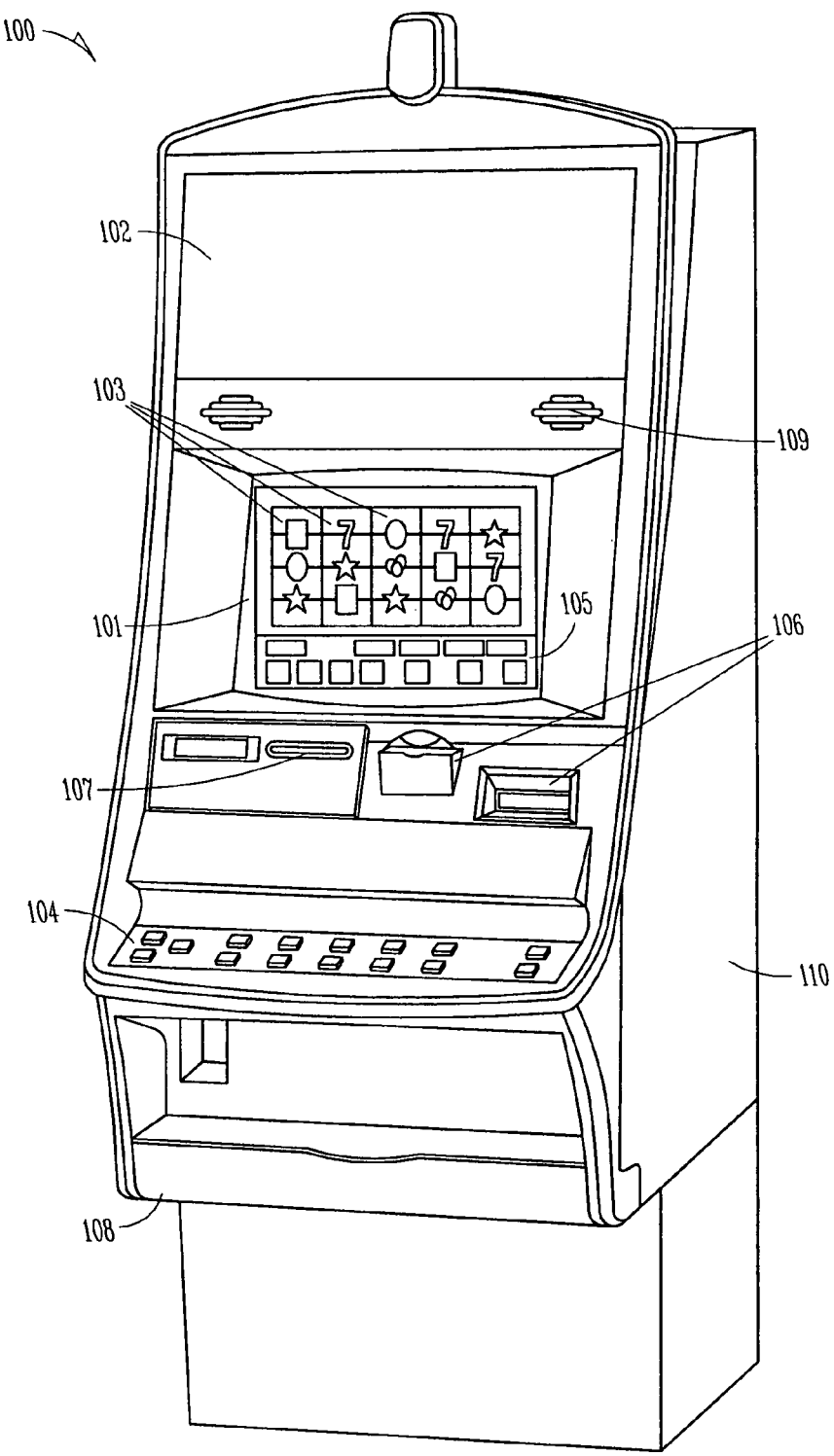
FIG. 1 shows a perspective view of a gaming machine system in accordance with one embodiment.

FIG. 1 illustrates a computerized wagering game machine system 100, as may be used to practice some embodiments of the present invention. The computerized gaming system shown generally at 100 is a video wagering game system including a gaming machine 110, which displays information for at least one wagering game upon which monetary value can be wagered on video display 101. Video display 101 is in various embodiments a CRT display, a plasma display, an LCD display, a surface conducting electron emitter display, or any other type of display suitable for displaying electronically provided display information. In some further embodiments, additional displays such as a bonus game display or top box display 102 are further operable to display electronically provided information to a wagering game player. Alternate embodiments of the invention will have other game indicators, such as mechanical reels instead of the video graphics reels shown at 103 that comprise a part of a video slot machine wagering game.

A wagering game is implemented using software within the wagering game, such as through instructions stored on a machine-readable medium such as a hard disk drive or nonvolatile memory. In some further example embodiments, some or all of the software stored in the wagering game machine is encrypted or is verified using a hash algorithm or encryption algorithm to ensure its authenticity and to verify that it has not been altered. For example, in one embodiment the wagering game software is loaded from nonvolatile memory in a compact flash card, and a hash value is calculated or a digital signature is derived to confirm that the data stored on the compact flash card has not been altered. The wagering game implemented via the loaded software takes various forms in different wagering game machines, including such well-known wagering games as reel slots, video poker, blackjack, craps, roulette, or hold 'em games. In some further embodiments, a secondary game or bonus game is displayed on the secondary display 102, or other information such as progressive slot information or other community game information is displayed.

The wagering game is played and controlled with inputs such as various buttons 104 or via a touchscreen overlay to video screen 101. The touchscreen is used in some embodiments to display virtual buttons, which can have unique functions in some embodiments, or can duplicate the functions provided by the mechanical buttons 104 in other embodiments. In some alternate examples, other devices such as virtual buttons 105 on the touchscreen display or a pull arm are employed to provide other input interfaces to the game player, such as to initiate reel spin. The player interface components are in this example contained within or mechanically coupled to the wagering game system, but in other embodiments will be located outside the wagering game system cabinet such as by a wired or wireless electronic connection to the wagering game system.

Monetary value is typically wagered on the outcome of the games, such as with tokens, coins, bills, or cards that hold monetary value. The wagered value is conveyed to the machine such as through a changer 106 or a secure user identification module interface 107, and winnings are returned such as via a returned value ticket, a stored value card, or through the coin tray 108. Sound is also provided through speakers 109, typically including audio indicators of game play, such as reel spins, credit bang-ups, and environmental or other sound effects or music to provide entertainment consistent with a theme of the computerized wagering game. In some further embodiments, the wagering game machine is coupled to a network, and is operable to use its network connection to receive wagering game data, track players and monetary value associated with a player, and to perform other such functions.

In other embodiments, the computerized wagering game system takes one or more other forms, such as a mobile or portable wagering game device, a server-based wagering game device, or a networked wagering game system. These other computerized wagering game system embodiments need not contain all features of the wagering game system of FIG. 1, which does not limit the scope of a computerized wagering game but is provided as an example only.

The wagering game machines 110 described herein can take any suitable form, such as floor standing models, handheld mobile units, bartop models, workstation-type console models, etc. Further, the wagering game machines 110 can be primarily dedicated for use in conducting wagering games, or can include non-dedicated devices, such as mobile phones, personal digital assistants, personal computers, etc.

In one embodiment, the wagering game machine 110 can include additional peripheral devices and/or more than one of each component shown in FIG. 1. For example, in one embodiment, the wagering game machine 110 can include multiple external system interfaces and multiple CPUs. In one embodiment, any of the components can be integrated or subdivided. Additionally, in one embodiment, the components of the wagering game machine 110 can be interconnected according to any suitable interconnection architecture (e.g., directly connected, hypercube, etc.).

In one embodiment, any of the components of the wagering game system 100 can include hardware, firmware, and/or software for performing the operations described herein. Machine-readable media includes any mechanism that provides (i.e., stores and/or transmits) information in a form readable by a machine (e.g., a wagering game machine, computer, etc.). For example, tangible machine-readable media includes read only memory (ROM), random access memory (RAM), magnetic disk storage media, optical storage media, flash memory machines, etc. Machine-readable media also includes any media suitable for transmitting software over a network.

Figure 2:
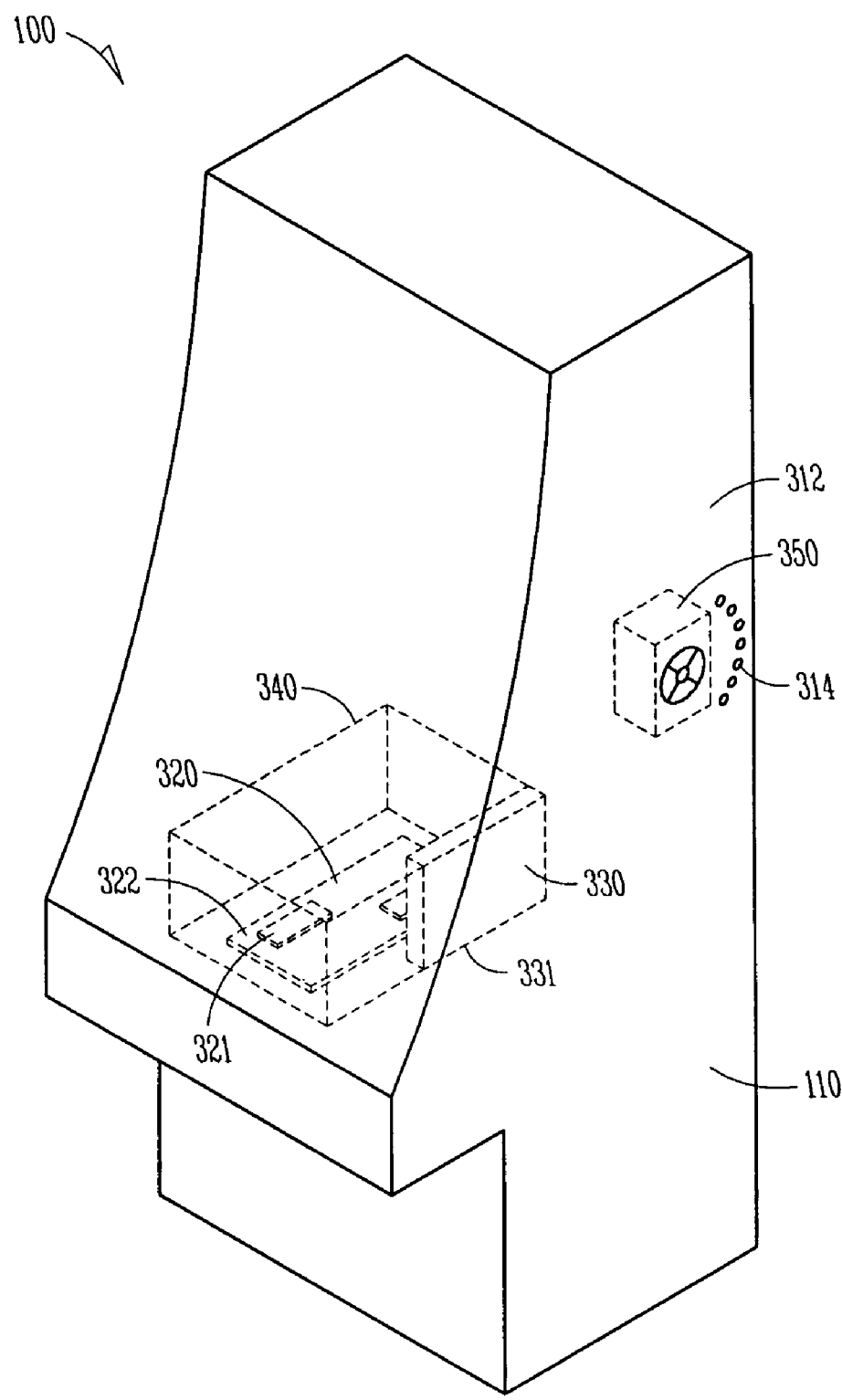
FIG. 2 shows a schematic view of an inner portion of the gaming machine system of FIG. 1.

FIG. 2 shows a schematic view of an inner portion of the gaming machine system 100 of FIG. 1. System 100 generally includes gaming machine 110 that can include any of the features discussed above for gaming machines. System 100 further includes one or more heat generating components 320, 330 located within gaming machine 110. Heat generating components 320, 330 can include a CPU 321 located on a motherboard 322, for example, a hard drive 331, and other mechanical or electrical components within gaming machine 110. In one embodiment, heat generating components 320, 330 are located with a CPU enclosure 340. CPU enclosure 340 is mounted within gaming machine 110 and includes certain components, hardware and software to run the gaming machine. For example, CPU enclosure 340 can include a metal box having a size about 12"×6"×3". The components, such as mother board 322 and/or hard drive 331 are mounted with the enclosure 340 and enclosure 340 includes power and signal inputs and outputs for the components to receive power and to functionally communicate with the other components of the gaming system.

CPU 321 is sometimes called a microprocessor, controller, or central processing unit (CPU). In some embodiments, more than one CPU is present, or different types of processors are present in the wagering game system, such as using multiple processors to run gaming code, or using dedicated processors for audio, graphics, security, or other functions. The processor is coupled via a bus to various other components, including memory and nonvolatile storage. The nonvolatile storage is able to retain the data stored therein when power is removed, and in various embodiments takes the form of a hard disk drive, nonvolatile random access memory such as a compact flash card, or network-coupled storage. Further embodiments include additional data storage technologies, such as compact disc, DVD, or HD-DVD storage in the wagering game system.

The bus also couples the CPU 321 and components to various other components, such as a value acceptor, which is in some embodiments a token acceptor, a card reader, or a biometric or wireless player identification reader. A touchscreen display and speakers serve to provide an interface between the wagering game system and a wagering game player, as do various other components such as buttons, pullarms, and joysticks. These components are located in a wagering game machine cabinet such as that of FIG. 1 in some embodiments, but can be located in multiple enclosures comprising a wagering game system or outside a wagering game machine cabinet in other embodiments.

In operation, the wagering game system loads program code from nonvolatile storage into memory, and the CPU 321 executes the program code to cause the wagering game system to perform desired functions such as to present a wagering game upon which monetary value can be wagered. This and other functions are provided by various modules in the computerized system such as an audio module, a game presentation module, or a touchscreen display module, where such modules comprise in some embodiments hardware, software, mechanical elements, manual intervention, and various combinations thereof Since the heat generating components 320, 330 develop heat; the heat must be removed to protect the components or other components within the gaming machine. In one embodiment, a thermoelectric cooler apparatus 350 is located within gaming machine 110 to draw heat from the one or more heat generating components 320, 330.

For example, in this embodiment, thermoelectric cooler apparatus 350 is mounted to an outer housing wall 312 of gaming machine 110 and is configured to direct heat out of gaming machine 110 via one or more openings 314 in the wall of the gaming machine. These openings can be in a side, front, top, or back wall of the gaming machine. In some embodiment, the openings have a louvered grille at the opening.

Figure 3:
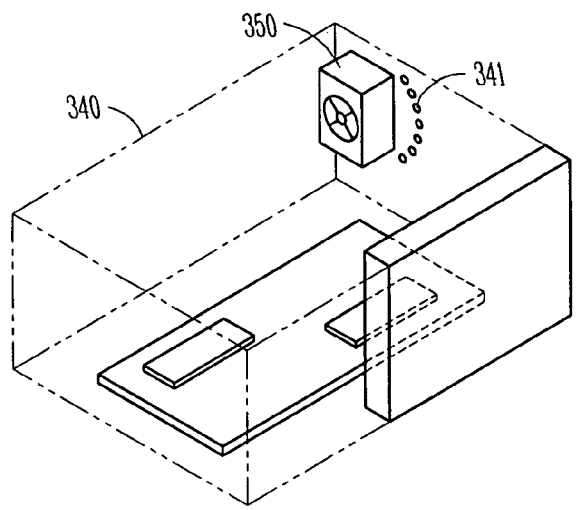
FIG. 3 shows a perspective view of a CPU enclosure for a gaming system, in accordance with one embodiment.
Figure 4:
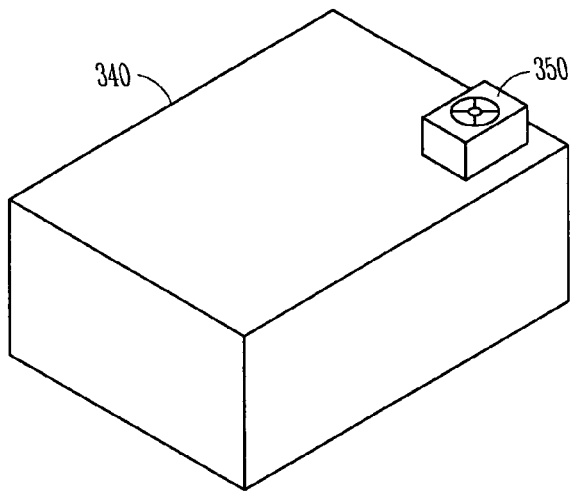
FIG. 4 shows a perspective view of a CPU enclosure for a gaming system, in accordance with one embodiment.

Referring to FIGS. 3 and 4, in some embodiments, thermoelectric cooler apparatus 350 can be mounted within CPU enclosure 340 and openings 341 direct heat outside enclosure 340. In other embodiments, as shown in FIG. 4, thermoelectric cooler apparatus 350 is mounted directly to an outside wall of CPU enclosure 340.

Figure 5:
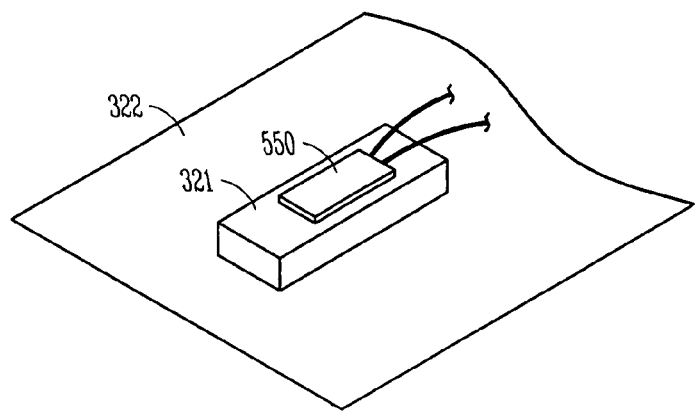
FIG. 5 shows a perspective view of a CPU motherboard, in accordance with one embodiment.

Referring to FIG. 5, in some embodiments, a thermoelectric cooler apparatus 550 is mounted directly on at least one of the one or more heat generating components, such as CPU 321.

In some embodiments, more than one thermoelectric cooler apparatus 350 or 550, as discussed above, can be utilized, such that one or more are directly attached to a heat generating component, one or more are mounted on or within CPU enclosure 340, and/or one or more are mounted to the gaming machine 110.

Figure 6:
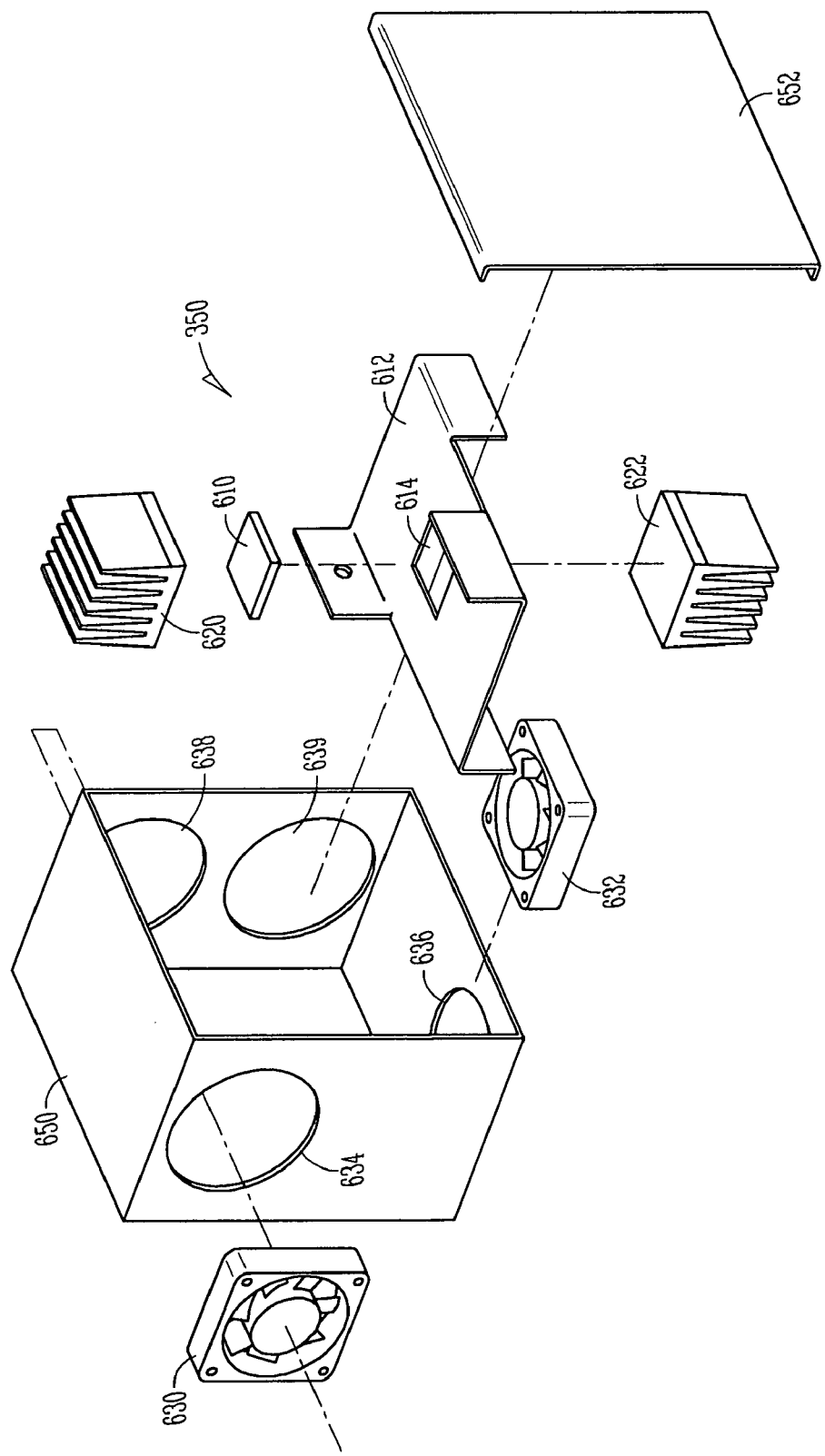
FIG. 6 shows an exploded perspective view of a thermoelectric cooler apparatus, in accordance with one embodiment.
Figure 7:
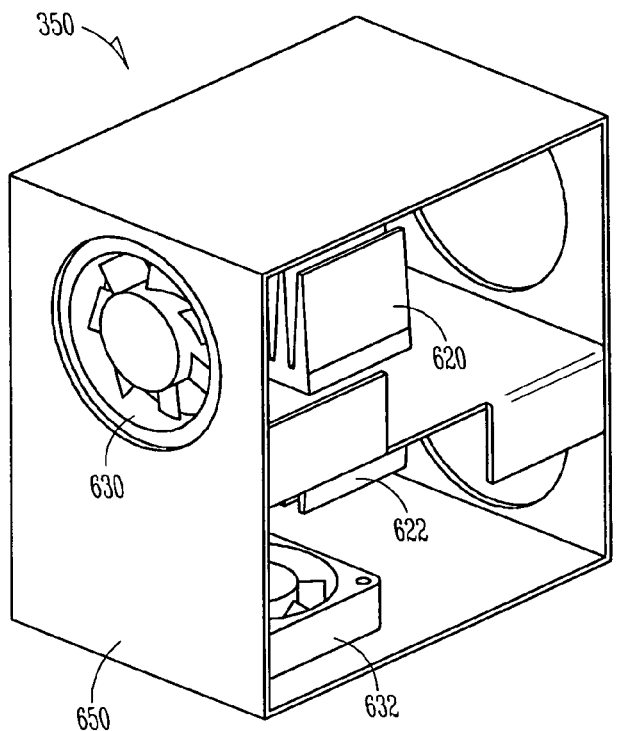
FIG. 7 shows a perspective view of a thermoelectric cooler apparatus, in accordance with one embodiment.
Figure 8:
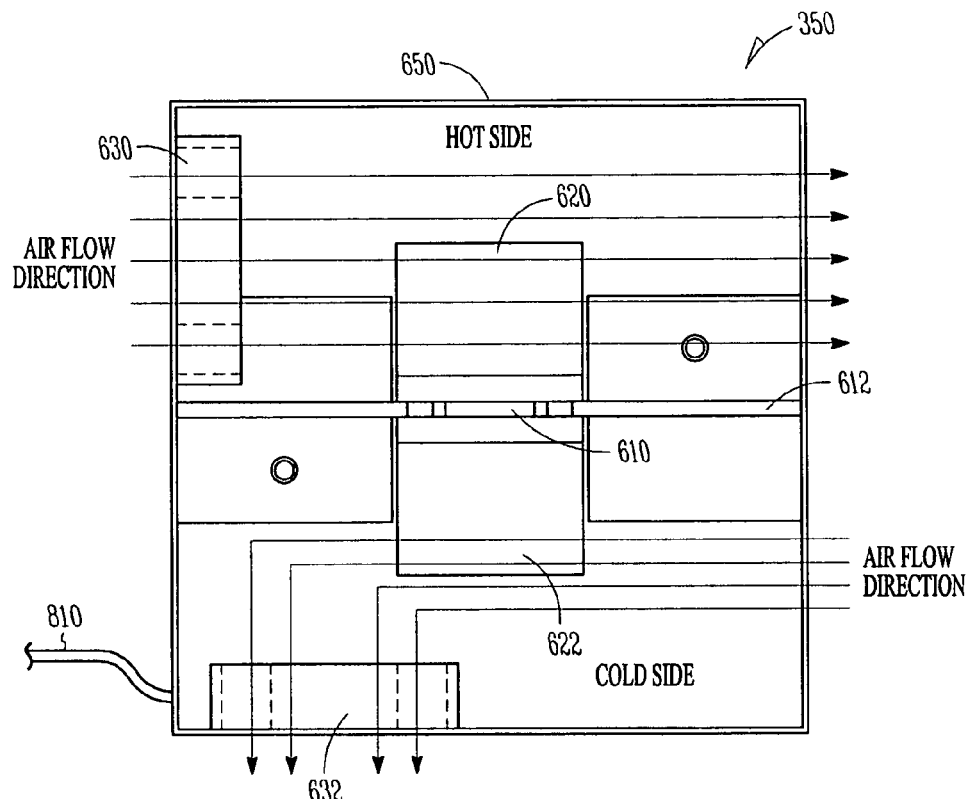
FIG. 8 shows a cross-section view of a thermoelectric cooler apparatus, in accordance with one embodiment.

FIG. 6 shows an exploded perspective view of thermoelectric cooler apparatus 350, in accordance with one embodiment. FIG. 7 shows a perspective view of thermoelectric cooler apparatus 350, and FIG. 8 shows a cross-section view of thermoelectric cooler apparatus 350.

Thermoelectric cooler apparatus 350 includes a thermoelectric cooler device 610 and at least one heat sink 620 mounted to thermoelectric cooler device 610. In one example, thermoelectric cooler device 610 includes a device having a shape of about 30 mm×30 mm and designed to remove enough heat to provide a temperature drop of about 10-20 degrees C.

Thermoelectric coolers, such as device 610, are solid state heat pumps used in applications where temperature stabilization, temperature cycling, or cooling below ambient are desired. Thermoelectrics is based on the Peltier Effect, by which DC current applied across two dissimilar materials causes a temperature differential.

One typical thermoelectric module is manufactured using two thin ceramic wafers with a series of P and N doped bismuth-telluride semiconductor material sandwiched between them. The ceramic material on both sides of the thermoelectric adds rigidity and the necessary electrical insulation. The N type material has an excess of electrons, while the P type material has a deficit of electrons. One P and one N make up a couple. The thermoelectric couples are electrically in series and thermally in parallel. A thermoelectric module can contain one to several hundred couples.

As the electrons move from the P type material to the N type material through an electrical connector, the electrons jump to a higher energy state absorbing thermal energy (cold side). Continuing through the lattice of material, the electrons flow from the N type material to the P type material through an electrical connector, dropping to a lower energy state and releasing energy as heat to the heat sink (hot side).

In one embodiment, thermoelectric cooler device 610 can be sandwiched between a first heat sink 620 and a second heat sink 622. First heat sink 620 is attached by a heat conductive paste or epoxy to the hot side of thermoelectric device 620 and second heat sink 622 is attached by a heat conductive paste or epoxy to the cool side of device 620.

In one example, cooler apparatus 350 including device 610 and heat sinks 620, 622 can be mounted within a cooler enclosure 650 with at least one fan 630 directing air over heat sink 620 and/or heat sink 622. For example, cooler enclosure 650 can include a central wall 612 with a hole 614. Thermoelectric device 610 can be mounted within hole 614 and heat sinks 620 and 622 can be mounted on either side of the device 610. Central wall 612 thus divides enclosure 650 into a hot side and a cool side. For example, in one embodiment, fan 630 is mounted proximate a hole 634 in enclosure 650 and pulls air out of the hot side of the apparatus 350 while air enters through hole 638. Likewise, a second fan 632 is mounted at a hole 636 and pulls air into the enclosure via hole 639. In some embodiments, fans 630, 632 can be mounted inside cooler enclosure 650 or on the outside of the enclosure 650.

Cooler apparatus 350, 550 discussed above can be installed by an OEM or as a retrofit. In one example, a power cord 810 provides the power supply for fans 630, 632 and device 610. The cord 810 can include a plug and be plugged directly into a receptacle, for example. In some embodiments, each component can be hardwired electrically to power with the gaming machine.

The embodiments of the thermoelectric cooler apparatus system discussed above cool gaming machines and the CPU enclosures within gaming machines more extensively than in the past. The thermoelectric device 610 and apparatus 350 are space efficient solutions to actively cool heat generating components. For example, apparatus 350, including device 610, heat sinks 620, 622 mounted within enclosure 650 and having fans 630, 632 can have a 3-D footprint of about 2"×2"×2"; or about 4"×4"×4" or less. Using the thermoelectric apparatus allows for cooling of heat generating components to a much greater degree than solely using fans to dissipate the heat. This allows the machine 110 to utilize higher performance electronic components, which in turn improves gameplay. Moreover, running the CPU at well below its maximum operating temperature allows the CPU to have fewer failures and less down time.

In some embodiments, the thermoelectric cooling apparatus discussed above can be used in place of, or in addition to, fans to cool such components as the CPU, power supply, displays, hard drives, and other heat generating components within a gaming machine.

General

In this detailed description, reference is made to specific examples by way of drawings and illustrations. These examples are described in sufficient detail to enable those skilled in the art to practice the inventive subject matter, and serve to illustrate how the inventive subject matter can be applied to various purposes or embodiments. Other embodiments are included within the inventive subject matter, as logical, mechanical, electrical, and other changes can be made to the example embodiments described herein. Features or limitations of various embodiments described herein, however essential to the example embodiments in which they are incorporated, do not limit the inventive subject matter as a whole, and any reference to the invention, its elements, operation, and application are not limiting as a whole, but serve only to define these example embodiments. This detailed description does not, therefore, limit embodiments of the invention, which are defined only by the appended claims.

Each of the embodiments described herein are contemplated as falling within the inventive subject matter, which is set forth in the following claims.

What is claimed is:

1. A system comprising:
    a gaming machine including a housing;
    one or more heat generating components within the gaming machine housing; and
    a thermoelectric cooler apparatus located within the gaming machine housing and operable to draw heat from the one or more heat generating components, the thermoelectric cooler apparatus including:
    a cooler enclosure having a hot side compartment and a cold side compartment separated by a wall member, the hot side compartment having a hot side inlet disposed within an interior of the gaming machine housing and a hot side outlet aligned with a first opening in an outer wall of the gaming machine housing, and the cold side compartment having a cold side inlet aligned with a second opening in the outer wall of the gaming machine housing and a cold side outlet disposed within the interior of the gaming machine housing;
    a thermoelectric device positioned within an opening in the wall member;
    a hot side heat sink disposed within the hot side compartment and directly coupled to a first surface of the thermoelectric device; and
    a cold side heat sink disposed within the cold side compartment and directly coupled to a second surface of the thermoelectric device.

2. The system of claim 1, wherein the one or more heat generating components includes a CPU.

3. The system of claim 1, wherein the one or more heat generating components includes a hard drive.

4. The system of claim 1, including a heat generating component enclosure located within the gaming machine and housing one or more of the one or more heat generating components.

5. The system of claim 1, wherein the thermoelectric cooler apparatus is mounted to the outer wall of the gaming machine housing and configured to direct heat out of the gaming machine.

6. The system of claim 1, wherein the thermoelectric cooler apparatus includes a first fan adjacent to the hot side inlet and configured for directing air over the hot side heat sink.

7. The system of claim 6, wherein the thermoelectric cooler apparatus includes a second fan adjacent to the cold side outlet and configured for directing air over the cold side heat sink.

8. The system of claim 7, wherein the cooler enclosure is mounted to the housing of the gaming machine and the first fan directs air out of the housing of the gaming machine.

9. A method comprising:
    mounting a thermoelectric cooler apparatus within a gaming machine housing having one or more heat generating components, the thermoelectric cooler apparatus including:
    a cooler enclosure having a hot side compartment and a cold side compartment separated by a wall member;
    a thermoelectric device positioned within an opening in the wall member;
    a hot side heat sink disposed within the hot side compartment and directly coupled to a first surface of the thermoelectric device; and
    a cold side heat sink disposed within the cold side compartment and directly coupled to a second surface of the thermoelectric device;
    drawing heat away from the one or more heat generating components, including pulling a first stream of air into the hot side compartment through a hot side inlet disposed within an interior of the gaming machine housing, and discharging the first stream of air through a hot side outlet aligned with a first opening in an outer wall of the gaming machine housing; and
    cooling the one or more heat generating components, including pulling a second stream of air into the cold side compartment through a cold side inlet aligned with a second opening in the outer wall of the gaming machine housing, and discharging the second stream of air through a cold side outlet disposed within an interior of the gaming machine housing.

10. The method of claim 9, wherein the thermoelectric cooler apparatus includes a first fan adjacent to the hot side inlet for pulling the first stream of air into the hot side compartment.

11. The method of claim 10, wherein the thermoelectric cooler apparatus includes a second fan adjacent to the cold side outlet for pulling the second stream of air into the cold side compartment.

12. The method of claim 9, wherein the one or more heat generating components includes a CPU.

13. The method of claim 9, wherein the one or more heat generating components includes a hard drive.

14. The method of claim 9, wherein the thermoelectric cooler apparatus is mounted to the housing of the gaming machine and configured to direct heat out of the gaming machine.

* * * * *